US009037890B2

(12) United States Patent
De Caro et al.

(10) Patent No.: US 9,037,890 B2
(45) Date of Patent: May 19, 2015

(54) ULTRA-DEEP POWER-DOWN MODE FOR MEMORY DEVICES

(75) Inventors: Richard V De Caro, El Dorado Hills, CA (US); Danut Manea, Saratoga, CA (US); Yongliang Wang, Saratoga, CA (US); Stephen Trinh, San Jose, CA (US); Paul Hill, Southampton (GB)

(73) Assignee: Artemis Acquisition LLC, Mountain View, CA (US)

( * ) Notice: Subject to any disclaimer, the term of this patent is extended or adjusted under 35 U.S.C. 154(b) by 336 days.

(21) Appl. No.: 13/559,320

(22) Filed: Jul. 26, 2012

(65) Prior Publication Data

US 2014/0032956 A1 Jan. 30, 2014

(51) Int. Cl.

| | |
|---|---|
| ***G06F 1/26*** | (2006.01) |
| ***G06F 1/32*** | (2006.01) |
| ***G11C 5/14*** | (2006.01) |
| ***G11C 16/30*** | (2006.01) |

(52) U.S. Cl.

CPC ............ *G06F 1/3275* (2013.01); *G06F 1/3206* (2013.01); *G06F 1/3203* (2013.01); *G06F 1/3287* (2013.01); *G11C 5/147* (2013.01); *G11C 5/148* (2013.01); *G11C 16/30* (2013.01); *G11C 2216/30* (2013.01); *Y02B 60/32* (2013.01); *Y02B 60/1228* (2013.01)

(58) Field of Classification Search

CPC ... G06F 1/3221; G06F 1/3225; G06F 1/3275; G06F 1/3287; G06F 3/0605; G06F 3/0679; G06F 21/79; G06F 1/26; G06F 1/3203; G06F 1/3206

USPC .......................... 713/300, 320, 324; 711/103

See application file for complete search history.

(56) References Cited

U.S. PATENT DOCUMENTS

2010/0188133 A1 7/2010 Burdett
2012/0110248 A1 * 5/2012 Deng et al. .................... 711/103

OTHER PUBLICATIONS

PCT Authorized Officer, Norbert Wolff, International Search Report and Written Opinion issued in the PCT Application No. PCT/US2012/062770 dtd May 3, 2013, 11 pgs.

Atmel Corporation, "9-megabit 2.7-volt Minimum SPI Serial Flash Memory," AT26DF081A, 3600G-DFLASH, 40 pages (Jun. 2009).

* cited by examiner

*Primary Examiner* — Michael J Brown

(74) *Attorney, Agent, or Firm* — Fish & Richardson P.C.

(57) ABSTRACT

A memory device includes a voltage regulator, whose output provides a voltage supply for various other components of the memory device, including a command user interface. The memory device is placed into an ultra-deep power-down mode by providing to the memory device a software command, which causes the output of the voltage regulator to be disabled. To bring the memory device out of the ultra-deep power-down mode, a chip select signal is provided to the memory device, which includes a wake-up circuit that remains powered on even when the memory device is in the ultra-deep power-down mode. Receipt of the chip select signal while the memory device is in the ultra-deep power-down mode causes the output of the voltage regulator to be enabled, thereby providing power to the components that were completely powered down.

26 Claims, 3 Drawing Sheets

ULTRA-DEEP POWER-DOWN MODE FOR MEMORY DEVICES

TECHNICAL FIELD

This disclosure relates to ultra-deep power-down modes for memory devices.

BACKGROUND

In many portable, battery-powered applications, power consumption is very important. Examples of such applications include, but are not limited to, cellular phones, pagers, camera recorders and laptops. These applications demand the lowest power consumption possible in order to prolong battery life and to enable the use of smaller, lower capacity batteries to reduce the application size, cost, and weight. Many of these applications use flash memory devices to store program code and, in some instances, the program code is copied into external or embedded microcontroller random access memory (RAM) after the application powers up. Since the code is shadowed from the flash memory into RAM, the flash memory does not need to be accessed until the next power cycle. In these instances, it can be desirable to put the flash memory device into as low a power mode as possible so as to consume the least amount of current.

Some applications completely remove power from the flash memory device to reduce the power consumption. However, doing so tends to increase the application complexity, as well as the cost, because an external power management device such as a low drop-out (LDO) regulator must be used to cut the power to the flash memory device.

SUMMARY

The present disclosure describes a memory device that can operate in an ultra-deep power-down mode in which only a very small amount of current is drawn from the device. In some implementations, the ultra-deep power-down mode may allow the average current consumption to be reduced to below one micro-amp (μA), and in some cases, as low as 300-400 nano-amps (nA).

In one aspect, a memory device includes a voltage regulator, whose output provides a voltage supply for various other components of the memory device, including a command user interface. The memory device is placed into an ultra-deep power-down mode by providing to the memory device a predetermined software command, which causes the output of the voltage regulator to be disabled. To bring the memory device out of the ultra-deep power-down mode, a chip select signal is provided to the memory device, which includes a wake-up circuit that remains powered on even when the memory device is in the ultra-deep power-down mode. Receipt of the chip select signal while the memory device is in the ultra-deep power-down mode causes the output of the voltage regulator to be enabled, thereby providing power to the components that were completely powered down.

Other aspects relate to methods and systems involving a memory device that is operable in an ultra-deep power-down mode.

Some implementations provide one or more of the following advantages. For example, the memory device can be placed into the ultra-deep power-down mode, and can exit the ultra-deep power-down mode, in a manner that saves a general purpose input/output (GP I/O) pin on the master host processor for other system functions. Also, placing the memory device into the ultra-deep power-down mode using a software opcode can provide greater flexibility. Furthermore, more complex, external power management device such as a low drop-out (LDO) regulator can be eliminated, thereby reducing overall costs. As some implementations may use fewer components, reliability may be enhanced as well.

Other aspects, features and advantages will be apparent from the following detailed description, the accompanying drawings and the claims.

BRIEF DESCRIPTION OF THE DRAWNGS

DETAILED DESCRIPTION

Figure 1:
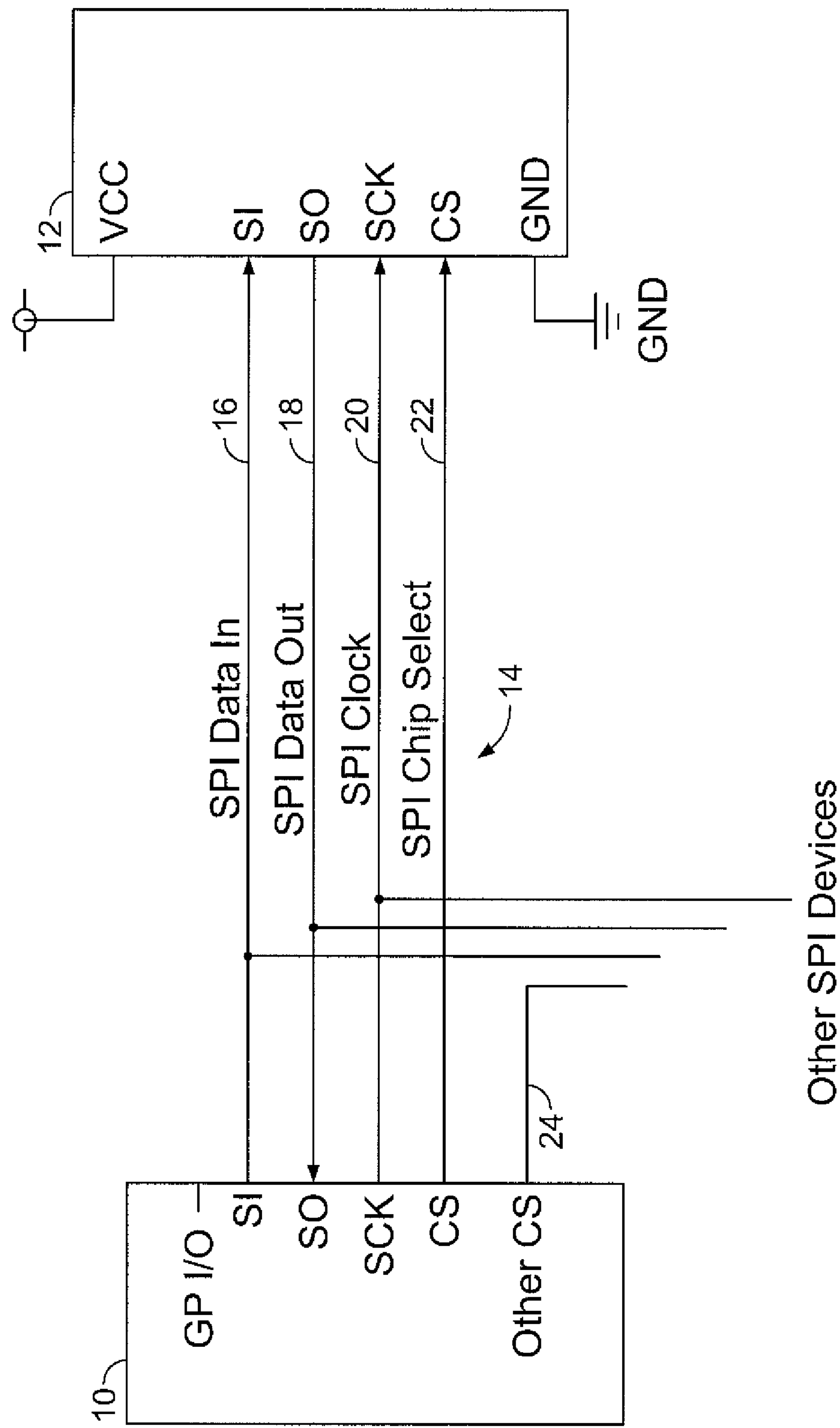
FIG. 1 is a simplified system connection between a host processor and a memory device.

As illustrated in FIG. 1, a master host device 10, such as a microcontroller, microprocessor, application-specific integrated circuit (ASIC) or application-specific standard product (ASSP), is coupled through a serial peripheral interface (SPI) bus 14 to a slave memory device 12, such as a flash or other memory device. The SPI bus 14 has various data and control lines including a SPI Data In line 16 for signals generated by the host processor 10 and received by the memory device 12, a SPI Data Out line 18 for signals generated by the memory device 12 and received by the host processor 10, a SPI clock line 20 for clock signals generated by the host processor 10 to synchronize data transfers between the devices 10, 12, and a SPI Chip Select line 22 for signals generated by the host processor 10 to select a particular slave or peripheral device. The SPI bus 14 may be coupled to additional SPI devices as well. In that case, additional chip select lines would be provided for the other SPI devices as well.

In some implementations, the memory device 12 is a serial-interface sequential access flash memory that can be used in a wide variety of digital voice, image, program code, and data storage applications. The techniques described in this document, however, can be used with other types of memory devices, including other types of non-volatile memory devices and other types of flash or SPI memory devices.

In the illustrated example, each of the host processor 10 and the memory device 12 has a SPI interface, including appropriate input/output pins for connection to the SPI bus 14. For example, the memory device 12 is enabled through a chip select pin (CS) and is accessed via a three-wire interface that includes a serial input (SI) pin, a serial output (SO) pin, and a serial clock (SCK) pin.

Asserting the CS pin selects the memory device 12. In the illustrated example, when the CS pin is de-asserted, the device is de-selected and normally is placed in a standby mode, and the output pin (SO) is in a high-impedance state. When the memory device 12 is deselected, data will not be accepted on the input pin (SI). A high-to-low transition on the CS pin is used to start an operation, and a low-to-high transition is used to end an operation.

The SCK pin is used to provide a clock to the memory device 12 and is used to control the flow of data to and from the device. In the illustrated example, command, address, and input data present on the SI pin is latched on the rising edge of the SCK signal, whereas output data on the SO pin is clocked out on the falling edge of the SCK signal.

The SI pin is used to shift data into the memory device 12. In the illustrated example, the SI pin is used for all data input including command and address sequences. Data on the SI pin is latched on the rising edge of the SCK signal. Data present on the SI pin is ignored whenever the memory device 12 is deselected (i.e., the CS pin is de-asserted).

The SO pin is used to shift data out from the memory device 12. In the illustrated example, data on the SO pin is clocked out on the falling edge of the SCK signal. The SO pin is in a high-impedance state whenever the device is deselected (i.e., when CS is de-asserted).

A VCC pin is used to supply the source voltage to the memory device 12, and a ground (GND) reference is connected to system ground in the illustrated implementation. The memory device 12 may include other pins as well.

The host processor 10 also includes a SI pin, a SO pin, a SCK pin and a CS pin. It also may include other pins, such as a general purpose input/output (GS I/O) pin and other chip select (CS) pins for selecting one of the other SPI devices.

Figure 2:
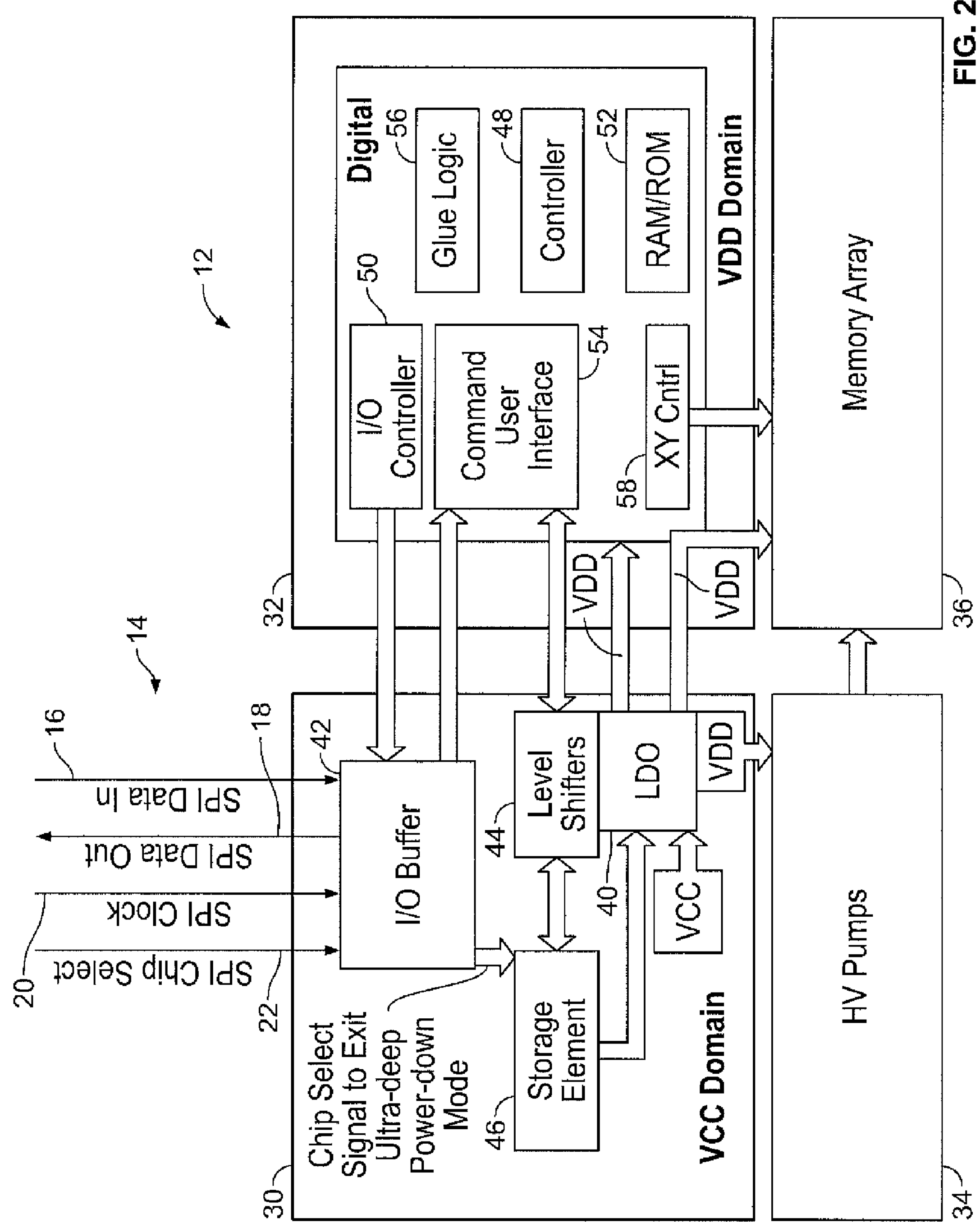
FIG. 2 is a block diagram showing various data processing units in an example memory device.

FIG. 2 illustrates various functional blocks that form part of the memory device 12 in some implementations and which may be implemented as part of a single integrated circuit memory device chip. In general, the memory device 12 can include VCC domain blocks (i.e., functional blocks or circuits that are powered by and operate using VCC power) 30, VDD domain blocks (i.e., functional blocks or circuits that are powered by and operated using a reduced power level VDD) 32, high voltage charge pumps 34 and a memory array 36. The memory device 12 itself can be powered by an external VCC power supply and includes a low drop-out (LDO) regulator 40 whose output serves as an internal on-chip voltage supply to provide the lower VDD voltage level to the VDD domain blocks 32, the high voltage charge pumps 34 and the memory array 36. Thus, the VDD domain blocks 32, the high voltage charge pumps 34 and the memory array 36 are powered by the LDO regulator 40.

In the illustrated example, the VCC domain blocks 30 also include an input/output buffer 42, level shifters 44, and a storage element 46, which stores the enabled/disabled state of the LDO regulator 40 and can be implemented, for example, as a latch such as a flip-flop circuit. Likewise, in the illustrated example, the VDD blocks 32 include various digital circuits such as a controller 48, an input/output controller 50, memory 52 (e.g., RAM and/or ROM), a command user interface (CUI) 54, glue logic 56 to interface between other logic units, and an XY controller 58 that interfaces with the memory array 36. The level shifters 44 are digital transfer devices that convert signals between the VCC and VDD supply domains. In some implementations, the VCC domain operates with 2.5 volts, whereas the VDD domain operates with 1.8 volts. The voltages may differ in other implementations.

Operation of the memory device 12 is controlled by instructions from the host processor 10. In the illustrated example, a valid instruction starts with the falling edge of the CS signal, followed by an 8-bit operation code (opcode) and the buffer or main memory address location.

In some applications, the memory device 12 stores program code, which may be copied into external RAM or RAM embedded in the host processor 10 after the application powers up. If the memory device 12 does not need to be accessed until the next power cycle, it may be desirable to put the memory device 12 into as low a power mode as possible so as to consume the least amount of current. There also may be other situations in which it is desirable to place the memory device 12 into a power-down mode. As explained below, the memory device 12 can be placed in an ultra-deep power-down mode in which only a very small amount of current is drawn from the device. In some implementations, the ultra-deep power-down mode allows the average current consumption to be reduced to well below one micro-amp (μA), and in some cases, as low as 300-400 nano-amps (nA). Thus, in some implementations, the disclosed techniques may reduce the current consumption by almost a factor of ten when the device is operated in the ultra-deep power-down mode. The actual power consumption in the ultra-deep power-down mode, however, may differ in other implementations.

The following paragraphs describe a protocol to enable an ultra-deep power-down mode in which the components of the memory device 12 that operate in the VDD domain are completely turned off. The protocol also enables the memory device 12 to exit the ultra-deep power-down mode.

Entering the ultra-deep power-down mode can be accomplished by providing a unique predetermined 8-bit command opcode from the host processor 10 to the buffer 42 over the SPI bus 14. After receiving the unique command opcode, the buffer 42 passes the unique command opcode to the command user interface 54. The command user interface 54 then passes the opcode to the level shifter 44 associated with decoding the command. The level shifter 44 converts the opcode to the appropriate VCC domain voltage level and transfers the opcode to the storage element 46, which as noted above, can be implemented, for example, as a flip-flop circuit. The storage element 46 then generates a signal to cause the output of the LDO regulator 40 to be disabled. Disabling the output of the LDO regulator 40 means that the VDD domain blocks 32 of the memory device 12, as well as the memory array 36 and high voltage charge pumps 34, are no longer powered. Thus, in the ultra-deep power-down mode, all components that normally are powered by the VDD voltage supply are completely powered down. By shutting down additional internal circuitry in the memory device 12, the ultra-deep power-down mode can allow the memory device 12 to consume less power compared to other low power or standby modes.

Since almost all active circuitry is shut down in the ultra-deep power-down mode to conserve power, the input/output controller 50 and the command user interface 54 are completely powered down during the ultra-deep power-down mode. Since any additional data clocked into the memory device 12 after the memory device enters the ultra-deep power-down mode (and before it exits that mode) will be ignored, all subsequent commands will be ignored (until the device exits the ultra-deep power-down mode). On the other hand, as all commands are ignored, the ultra-deep power-down mode can be used as an extra protection mechanism against program and erase operations.

When the memory device 12 is in the ultra-deep power-down mode, the device continues to be powered by the VCC voltage, such that the VCC domain blocks 30 (including the storage element 46, the LDO regulator 40 and I/O buffers 42) remain connected to the VCC voltage. Nevertheless, in this state, the LDO regulator 40, which can be implemented as a relatively small circuit, can have a very small amount of leakage, thereby helping keep the overall power consumption of the memory device 12 at a very low level during the ultra-deep power-down mode.

Figure 3:
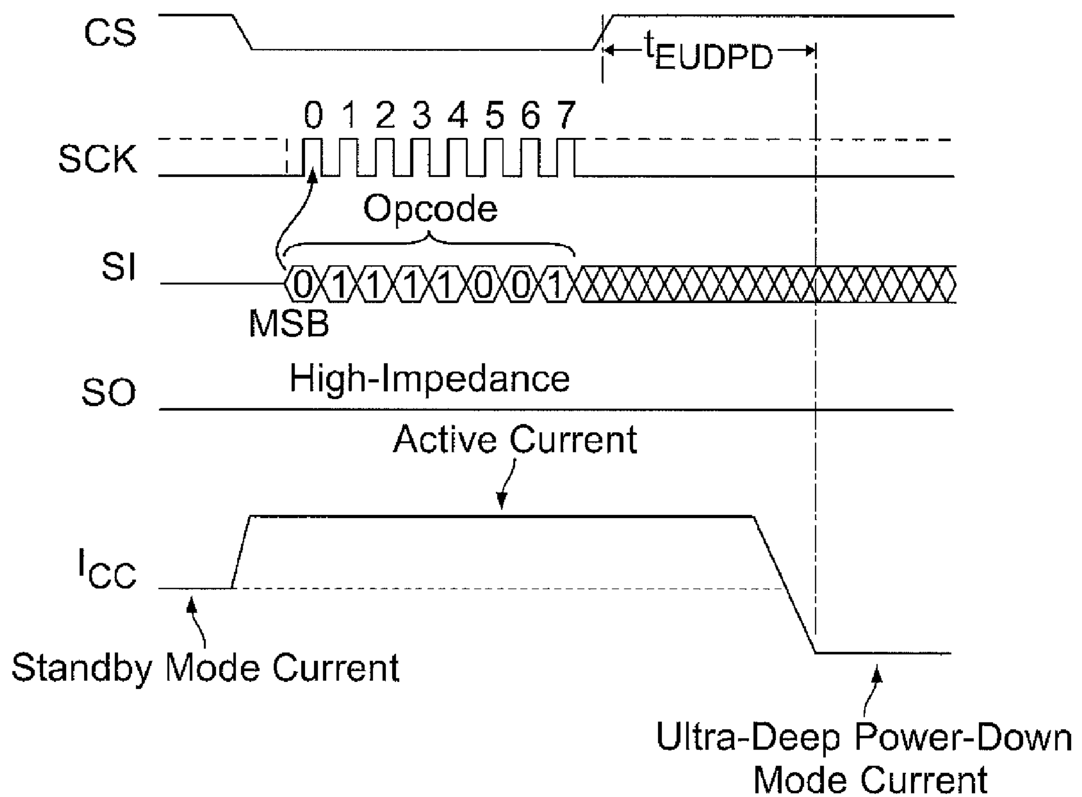
FIG. 3 is an example timing diagram for various signals to place the memory device in an ultra-deep power-down mode.

As illustrated by the timing diagram of FIG. 3, entering the ultra-deep power-down mode can be accomplished by asserting the CS pin on the memory device 12, clocking in the unique predetermined command opcode, and then de-asserting the CS pin. The complete opcode should be clocked in before the CS pin is de-asserted. When the CS pin is de-asserted, the memory device 12 enters the ultra-deep power-down mode within a time "tEUDPD." In some implementations, the ultra-deep power-down command will be ignored if an internally self-timed operation, such as a program or erase cycle, is in progress.

As noted above, the input/output controller 50 and the command user interface 54 are completely powered down during the ultra-deep power-down mode and, thus, all opcode commands are ignored by the memory device 12 when it is in the ultra-deep power-down mode. This means that, in the illustrated example, an opcode command (i.e., a software instruction) sent over the SPI Data Out line 18 of the SPI bus 14 cannot be used to bring the memory device 12 out of the ultra-deep power-down mode.

Instead, to wake the memory device 12 and bring it out of the ultra-deep power-down mode, the signal on the SPI Chip Select line 22 of the SPI bus 14 is toggled, and the signal is received at the CS pin of the memory device 12. When the device 12 is in the ultra-deep power-down mode, the buffer 42 passes the chip select signal directly to the storage element 46, which generates a signal to cause the output of the LDO regulator 40 to be enabled. Enabling the output of the LDO regulator 40 provides the VDD voltage to the various VDD domain blocks 32, as well as the high voltage charge pumps 34 and the memory array 36, thus restoring the memory device 12 to standby mode. Thus, although the memory device 12 is placed into the ultra-deep power-down mode using a software command (i.e., the opcode), the memory device is brought out of the ultra-deep power-down mode using only hardware features of the memory device 12.

Figure 4:
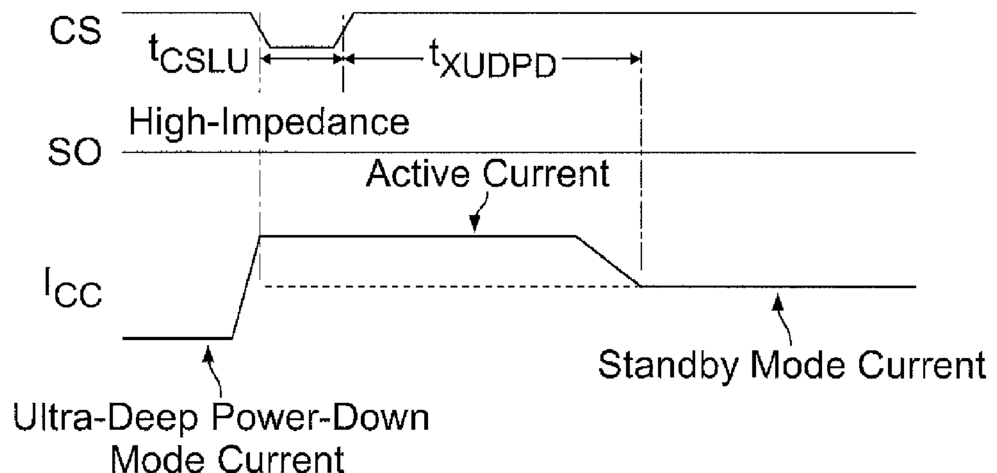
FIG. 4 is an example timing diagram for various signals for exiting the ultra-deep power-down mode.

As illustrated by the example of FIG. 4, to exit from the ultra-deep power-down mode, the SPI Chip Select line 22 of the SPI bus 14 is pulsed to assert the CS pin of the memory device 12. After waiting a minimum time "tCSLU," the CS pin of the memory device 12 is de-asserted again.

To facilitate simple software development, a dummy byte opcode can be provided over the SPI Data Out line 18 while the CS pin is being pulsed to cause the memory device 12 to exit the ultra-deep power-down mode. The dummy byte opcode is simply ignored by the memory device 12 since it is still in ultra-deep power-down mode. After the CS pin of the memory device 12 is de-asserted, the device 12 will exit from the ultra-deep power-down mode and will return to the standby mode within a time "tXUDPD." In the illustrated example, if the CS pin is re-asserted before the "tXUDPD" time has elapsed in an attempt to start a new operation, then that operation will be ignored and nothing will be performed in response to that operation. Instead, the system waits for the device 12 to return to the standby mode before normal command operations can be resumed.

Other implementations are within the scope of the claims.

What is claimed is:

1. A method of controlling power consumption of a memory device, wherein the memory device is configured to be powered by a power supply at a first voltage level, the memory device including a first group of components that operate using the first voltage level and a second group of components that operate using a second voltage level lower than the first voltage level, wherein the memory device further includes a voltage regulator that operates using the first voltage level and is operable to provide the second voltage level as an output to power the second group of components, the method comprising:

providing to the memory device a software command instructing the memory device to go into a power-down mode;

disabling automatically the output of the voltage regulator in response to receiving the software command in the memory device; and powering down the second group of components based on disabling the output of the voltage regulator, while the first group of components remain powered on.

2. The method of claim 1 wherein the second group of components includes a command user interface, which handles the software command and which is completely turned off when the output of the voltage regulator is disabled.

3. The method of claim 1, wherein the second group of components includes a memory array and high voltage charge pumps.

4. The method of claim 1 including:

receiving the software command in the memory device over a serial peripheral interface bus;

passing the software command to a command user interface that is powered by the output of the voltage regulator; and passing a first signal corresponding to the software command to a level shifter that provides an output to a latch whose output controls whether the voltage regulator output is enabled or disabled.

5. The method of claim 1 wherein the memory device exhibits average current consumption of less than 1 microamp when the output of the voltage regulator is disabled and the voltage regulator is powered by the first voltage level.

6. The method of claim 1 wherein the memory device exhibits average current consumption of less than 400 nanoamps when the output of the voltage regulator is disabled and the voltage regulator is powered by the first voltage level.

7. The method of claim 1 including:

receiving a toggled signal at a chip select pin of the memory device; and in response to receiving the toggled signal, enabling the output of the voltage regulator.

8. The method of claim 1 including passing a signal received at a chip select pin included in the memory device to a latch whose output controls whether the voltage regulator is enabled or disabled.

9. The method of claim 1 wherein the first group of components includes a latch whose output controls whether the voltage regulator is enabled or disabled.

10. The method of claim 1 including:

receiving a logic level high to logic level low signal at a chip select pin of the memory device; and in response to receiving the logic level high to logic level low signal, enabling the output of the voltage regulator.

11. A memory device operable in an ultra-deep power-down mode, the memory device comprising:

a command user interface;

a voltage regulator whose output provides a voltage supply for various components of the memory device, including the command user interface; and a wake-up circuit that remains powered on even when the memory device is in the ultra-deep power-down mode, wherein the memory device is operable to be placed into the ultra-deep power-down mode by receiving a predetermined software command, which causes the output of the voltage regulator to be disabled, and wherein the memory device is operable to be brought out of the ultra-deep power-down mode by receiving a chip select signal, wherein receipt of the chip select signal while the memory device is in the ultra-deep power-down mode causes the output of the voltage regulator to be enabled, thereby providing power to components of the memory device that were completely powered down during ultra-deep power-down mode.

12. The memory device of claim 11, wherein a small amount of current is drawn from the memory device when the memory device is in the ultra-deep power-down mode.

13. A memory device configured to be powered by a power supply at a first voltage level, the memory device comprising:

a first group of components that operate using the first voltage level and a second group of components that operate using a second voltage level lower than the first voltage level, a voltage regulator that operates using the first voltage level and is operable to provide the second voltage level as an output to power the second group of components;

wherein the first group of components includes a storage element having an output that controls whether the output of the voltage regulator is enabled or disabled, and wherein the second group of components includes a command user interface; and a level shifter to convert a signal from the command user interface between the second voltage level and the first voltage level, and to provide a signal to the storage element at the first voltage level, wherein receipt by the memory device of a predetermined software command that instructs the memory device to go into a ultra-deep power-down mode is handled by the command user interface, which, in response to receiving the predetermined software command, passes a signal through the level shifter to the storage element to disable the output of the voltage regulator, and wherein, when the output of the voltage regulator is disabled, receipt by the memory device of a chip select signal causes the storage element to enable the output of the voltage regulator.

14. The memory device of claim 13 wherein the memory device is a flash memory device coupled to a host device by a serial peripheral interface bus.

15. The memory device of claim 14 wherein the predetermined software command is received over a data line of the serial peripheral interface bus and the chip select signal is received over a chip select line of the serial peripheral interface bus.

16. The memory device of claim 13 wherein the second group of components further includes a memory array.

17. The memory device of claim 16 wherein the second group of components further includes high voltage charge pumps.

18. The memory device of claim 13 wherein the memory device exhibits average current consumption of less than 1 micro-amp when the output of the voltage regulator is disabled even though the voltage regulator is powered by the first voltage level.

19. The memory device of claim 13 wherein the memory device exhibits average current consumption of less than 400 nano-amps when the output of the voltage regulator is disabled even though the voltage regulator is powered by the first voltage level.

20. The memory device of claim 13 wherein all components in the second group are completely powered down when the output of the voltage regulator is disabled.

21. The memory device of claim 13 wherein the storage element comprises a latch.

22. The memory device of claim 13 wherein the storage element comprises a flip-flop circuit.

23. The memory device of claim 13 further including an input/output buffer, wherein when the output of the voltage regulator is disabled and the memory device is in the ultra-deep power-down mode, the chip select signal is provided directly from the input/output buffer to the storage element whose output controls whether the voltage regulator is enabled or disabled.

24. A system comprising:

a host controller;

a serial peripheral interface bus; and a memory device coupled to the host controller by the serial peripheral interface bus, wherein the memory device comprises:

a connection to a power supply that provides a first voltage level;

a first group of components that operate using the first voltage level and a second group of components that operate using a second voltage level lower than the first voltage level;

a voltage regulator that operates using the first voltage level and is operable to provide the second voltage level as an output to power the second group of components, wherein the first group of components includes a storage element having an output that controls whether the output of the voltage regulator is enabled or disabled, and wherein the second group of components includes a command user interface; and a level shifter to convert a signal from the command user interface between the second voltage level and the first voltage level, and to provide a signal to the storage element at the first voltage level, wherein receipt by the memory device of a predetermined software command that instructs the memory device to go into a ultra-deep power-down mode is handled by the command user interface, which, in response to receiving the predetermined software command, passes a signal through the level shifter to the storage element to disable the output of the voltage regulator, thereby placing the memory device in the ultra-deep power-down mode, and wherein, when the output of the voltage regulator is disabled, receipt by the memory device of a chip select signal causes the storage element to enable the output of the voltage regulator.

25. The system of claim 24 wherein the first group of components remains connected to the first voltage level even when the memory device is in the ultra-deep power-down mode.

26. The system of claim 25 wherein the second group of components is completely powered down when the memory device is in the ultra-deep power-down mode.

* * * * *